US008653488B2

(12) United States Patent
Kobayashi

(10) Patent No.: US 8,653,488 B2
(45) Date of Patent: Feb. 18, 2014

(54) ELECTRON BEAM APPARATUS

(75) Inventor: Masaki Kobayashi, Tokyo (JP)

(73) Assignee: NuFlare Technology, Inc., Numazu-shi (JP)

(*) Notice: Subject to any disclaimer, the term of this patent is extended or adjusted under 35 U.S.C. 154(b) by 185 days.

(21) Appl. No.: 12/990,933

(22) PCT Filed: Jul. 30, 2008

(86) PCT No.: PCT/JP2008/063690
§ 371 (c)(1),
(2), (4) Date: Dec. 21, 2010

(87) PCT Pub. No.: WO2010/013331
PCT Pub. Date: Feb. 4, 2010

(65) Prior Publication Data
US 2011/0114853 A1    May 19, 2011

(51) Int. Cl.
*H01J 37/08* (2006.01)
(52) U.S. Cl.
USPC ............. 250/492.3; 250/492.1; 250/491.1
(58) Field of Classification Search
None
See application file for complete search history.

(56) References Cited

U.S. PATENT DOCUMENTS

| | | | | |
|---|---|---|---|---|
| 4,728,797 | A * | 3/1988 | Gotou et al. | 250/492.2 |
| 5,334,846 | A * | 8/1994 | Nakano et al. | 250/492.2 |
| 5,345,085 | A * | 9/1994 | Prior | 250/491.1 |
| 6,027,843 | A * | 2/2000 | Kojima et al. | 430/30 |
| 6,040,096 | A * | 3/2000 | Kakizaki et al. | 430/5 |
| 6,287,876 | B1 * | 9/2001 | Fujiwara | 438/4 |
| 6,559,456 | B1 * | 5/2003 | Muraki | 250/491.1 |
| 6,583,430 | B1 * | 6/2003 | Muraki | 250/492.22 |
| 6,765,647 | B1 * | 7/2004 | Nishi | 355/55 |
| 6,798,491 | B2 * | 9/2004 | Nishi et al. | 355/53 |
| 6,897,963 | B1 * | 5/2005 | Taniguchi et al. | 356/500 |
| 2006/0243921 | A1 * | 11/2006 | Inanami | 250/492.22 |
| 2007/0216767 | A1 * | 9/2007 | Kojima | 348/80 |
| 2008/0218713 | A1 * | 9/2008 | Shibazaki | 355/52 |

FOREIGN PATENT DOCUMENTS

| | | | | |
|---|---|---|---|---|
| EP | 1755001 A1 * | 2/2007 | | G11B 7/26 |
| JP | 8-212950 A | 8/1996 | | |
| JP | 9-190651 A | 7/1997 | | |
| JP | 10-180073 A | 7/1998 | | |
| JP | 2002-56793 A | 2/2002 | | |
| JP | 2002056793 A * | 2/2002 | | H01J 37/04 |
| JP | 2002-334821 A | 11/2002 | | |
| JP | 2002334821 A * | 11/2002 | | H01L 21/027 |
| JP | 2004-342628 A | 12/2004 | | |
| JP | 2004342628 A * | 12/2004 | | H01J 37/04 |
| JP | 2005-64041 A | 3/2005 | | |
| JP | 2005064041 A * | 3/2005 | | H01L 21/027 |
| JP | 2005-276639 A | 10/2005 | | |
| JP | 2005276639 A * | 10/2005 | | H01J 37/28 |

(Continued)

*Primary Examiner* — Andrew Smyth
(74) *Attorney, Agent, or Firm* — Oblon, Spivak, McClelland, Maier & Neustadt, L.L.P.

(57) ABSTRACT

An electron beam lithography apparatus includes a beam current detector which detects, during drawing of the drawing data, fluctuation of an irradiation position of the electron beam at non-irradiation on the substrate; a beam position error detector which detects a beam position error of the electron beam based on the fluctuation of the irradiation position; a drive position error detector which detects a drive position error of the stage due to rotation and translation drive during drawing of the drawing data; and a corrector which corrects the irradiation position of the electron beam during the drawing based on the beam position error and the drive position error.

5 Claims, 6 Drawing Sheets

(56) References Cited

FOREIGN PATENT DOCUMENTS

| | | | |
|---|---|---|---|
| JP | 2006-294794 A | | 10/2006 |
| JP | 2006294794 A | * | 10/2006 |
| JP | 2007-194096 A | | 8/2007 |
| JP | 2007194096 A | * | 8/2007 |
| WO | 2005/121902 A1 | | 12/2005 |
| WO | 2007/037013 A1 | | 4/2007 |

* cited by examiner

ELECTRON BEAM APPARATUS

TECHNICAL FIELD

The present invention relates to an electron beam apparatus and particularly to an electron beam lithography apparatus for producing a master of recording media or the like by electron beam exposure.

BACKGROUND ART

Electron beam lithography apparatuses that perform lithography using an electron beam as an exposure beam are widely applied to master producing apparatuses for optical discs such as digital versatile discs (DVDs) and Blu-ray discs and large capacity discs such as magnetically recording hard discs, and are also used in producing record media referred to as discrete track media or patterned media.

When a master for the above-described discs or the like is produced using the electron beam lithography apparatus, a resist layer is formed on the recording surface of a substrate that is to become a master disc, and control is performed such that by making the substrate rotate and simultaneously move translationally so as to relatively move a beam spot in a radial direction and in a tangential direction with respect to a substrate drawing surface as needed, spiral-like or concentric tracks are drawn on the substrate drawing surface to form latent images in the resist.

In the electron beam lithography apparatus, the electron optical system for the electron beam and the electron column housing the electron optical system therein vibrate due to vibrations of the stage for the translational movement of the substrate and the rotation drive system, or vibrations caused by external disturbance or the like. The irradiation position of the electron beam on the substrate drawing surface also fluctuates due to these vibrations, and hence the irradiation position fluctuation caused by the electron beam irradiating system needs to be corrected for. Further, because an irradiation position error occurs due to a driving mechanism system for the stage, that is, a rotation drive and translation drive (feed drive) system for the stage on which a substrate is mounted, the mechanism system position error needs to be corrected for.

As a beam position fluctuation measuring method used for this correction, there is a technique described in, for example, Patent Reference 1 as in the following. In this reference, a beam current detector (Faraday cup), which has been moved immediately below the aperture on the optical axis of the ion beam optical system in measurement, is used to measure beam position fluctuation from change in the amount of current thereof (a fixed method). However, beam position fluctuation data is collected before record data is drawn, and hence beam position fluctuation when being actually drawn may be different from beam position fluctuation at the measurement. Further, the correction signal is limited in frequency to a specific frequency component because a correcting signal is stored in a memory.

Yet further, correction is performed by deflecting the beam in an opposite direction to the fluctuation while a waveform stored in a memory is output synchronously with the specific frequency, when drawing (recording) on a substrate (a master). Thus, there is a problem that the correction effect is small since the correction is performed by feed-forward control.

Further, position errors due to the mechanism system are measured while drawing, and correction is performed by deflecting the electron beam based on the mechanism system position errors. The measurement of the mechanism system position errors and the beam irradiation position correction are described in, for example, Patent References 2, 3 as in the following.

As described above, the electron beam irradiation position fluctuates due to the electron beam irradiating system and the mechanism system. Conventionally, it is difficult to correct for this composite irradiation position error sufficiently accurately. In particular, in applying to large capacity discs such as hard discs, of which even higher density drawing by an electron beam having a very small beam spot is desired, as described above, highly accurate control of the electron beam irradiation position is crucially important.

Patent Reference 1: Japanese Patent Application Laid-Open Publication No. H08-212950 (p. 3, FIG. 2)

Patent Reference 2: Japanese Patent Application Laid-Open Publication No. H10-180073

Patent Reference 3: Japanese Patent Application Laid-Open Publication No. 1997-190651

SUMMARY OF THE INVENTION

Problem to be Solved by the Invention

The present invention was made in view of the above facts, and an object thereof is to provide an electron beam lithography apparatus which can perform drawing while performing beam fluctuation correction highly accurately.

Means for Solving the Problem

According to the present invention, there is provided an electron beam lithography apparatus in which a substrate is mounted on a stage that is driven to rotate and move translationally and which performs drawing by switching between irradiation and non-irradiation of an electron beam on the substrate by means of deflection of the electron beam according to drawing data. The lithography apparatus comprises a beam current detector which detects, during drawing of the drawing data, fluctuation of an irradiation position of the electron beam at non-irradiation on the substrate; a beam position error detector which detects a beam position error of the electron beam based on the fluctuation of the irradiation position; a drive position error detector which detects a drive position error of the stage due to rotation and translation drive during drawing of the drawing data; and a corrector which corrects the irradiation position of the electron beam during the drawing based on the beam position error and the drive position error.

EXPLANATION OF REFERENCE NUMERALS

Figure 1:
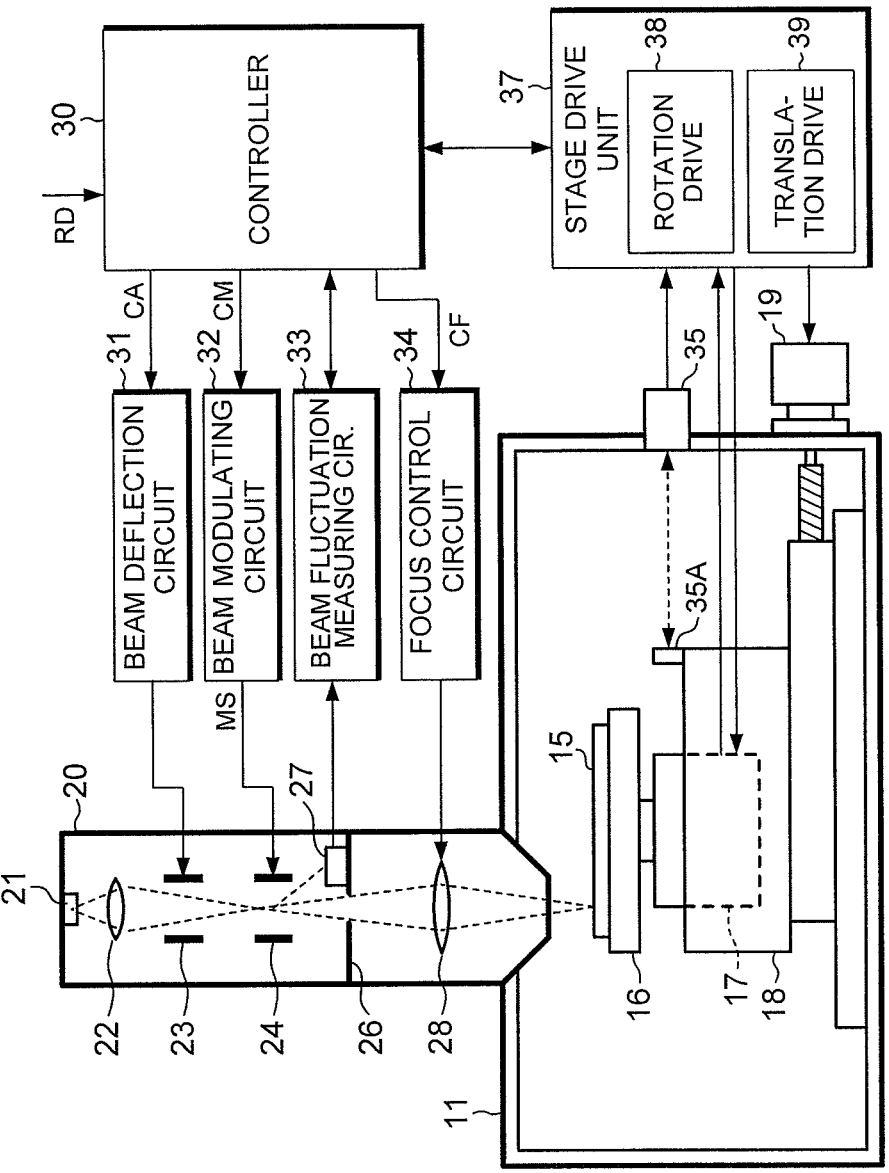
FIG. 1 is a block diagram showing schematically an example of the configuration of an electron beam lithography apparatus 10 according to a first embodiment of the present invention.

10 Electron beam lithography apparatus
15 Substrate
16 Turntable
17 Spindle motor
18 Translation stage
23 Beam deflecting electrode
24 Beam modulating electrode
26 Aperture
27 Beam current detector
30 Controller
31 Beam deflection circuit
32 Beam modulating circuit
33 Beam fluctuation measuring circuit
35 Laser interferometer
37 Stage drive unit
38 Rotation drive portion
39 Translation drive portion
41 Beam error signal generator
45 Driving system error signal generator
46 Beam correcting circuit

DETAILED DESCRIPTION OF THE INVENTION

Embodiments of the present invention will be described below in detail with reference to the drawings. The same reference numerals are used to denote equivalent constituents throughout the embodiment below.

First Embodiment

FIG. 1 is a block diagram showing schematically an example of the configuration of an electron beam lithography apparatus 10 according to a first embodiment of the present invention. The electron beam lithography apparatus 10 is a disc mastering apparatus which produces a disc master for the manufacture of optical discs or hard discs using an electron beam.

[Configuration and Operation of the Electron Beam Lithography Apparatus]

The electron beam lithography apparatus 10 comprises a vacuum chamber 11, a drive unit placed in the vacuum chamber 11 which has a substrate 15 mounted thereon and drives the substrate to rotate and move translationally, an electron beam column 20 mounted to the vacuum chamber 11, and a control system including various circuits for the drive control of the substrate, electron beam control, and so on.

More specifically, the substrate 15 to be a disc master has a resist coated over its surface, and is mounted on a turntable (or rotating stage) 16. The turntable 16 that is a rotating stage is driven to rotate around a vertical axis of the principal surface of the disc substrate by a spindle motor 17 that is a rotation drive unit for driving the substrate 15 to rotate. The spindle motor 17 is provided on a translation stage (hereinafter, also referred to as an X-stage) 18. The X-stage 18 is coupled to a translation motor 19 that is a translation drive unit, and can move the spindle motor 17 and the turntable 16 in a predetermined direction (here an x-direction) in a plane parallel to the principal surface of the substrate 15. Thus, the X-stage 18, the spindle motor 17, and the turntable (rotating stage) 16 constitute an X-θ stage. Note that the X-stage 18 may be configured to be also movable in a direction (y-direction) perpendicular to the x-direction in a plane parallel to the principal surface of the substrate 15.

The spindle motor 17 and the X-stage 18 are driven by a stage drive unit 37. More specifically, the stage drive unit 37 comprises a rotation drive portion 38 and a translation drive portion (or feed drive portion) 39 that are control portions which respectively drive the spindle motor 17 and the X-stage 18 and control rotation amounts, which are drive amounts, such as the rotation angle (i.e., the rotation angle of the substrate 15) and rotation speed of the turntable 16 and stage drive amounts such as the translation amount of the X-stage 18. The rotation drive portion 38 and a translation drive portion 39 operate under the control of a controller 30, details of which will be described later.

The turntable 16 is made of a dielectric such as a ceramic and has a chucking mechanism such as an electrostatic chucking mechanism (not shown) for holding the substrate 15. The substrate 15 mounted on the turntable 16 is reliably secured to the turntable 16 by the chucking mechanism.

There is placed a reflecting mirror 35A forming part of a laser interferometer 35 on the X-stage 18. The laser interferometer 35 measures the distance from the X-stage 18 based on reflected laser light from the reflecting mirror 35A and supplies resultant data to the translation drive portion 39.

The vacuum chamber 11 is placed via a vibration isolation mount (not shown) such as an air damper to suppress the transmission of external vibrations. Further, a vacuum pump (not shown) is connected to the vacuum chamber 11 and is set to exhaust the chamber, thereby producing a vacuum atmosphere of a predetermined pressure inside the vacuum chamber 11.

In the electron beam column 20, an electron gun (emitter) 21 that emits an electron beam, a convergence lens 22, a beam deflecting electrode 23, a beam modulating electrode 24, an aperture 26, and a focus lens 28 are arranged in this order.

The electron gun 21 emits an electron beam (EB) accelerated to, e.g., several tens KeV by a cathode electrode (not shown) to which a high voltage supplied from an acceleration high-voltage power supply (not shown) is applied. The convergence lens 22 makes the emitted electron beam converge.

The beam deflecting electrode 23 can control the deflection of the electron beam at high speed based on a deflection adjusting signal from a beam deflection circuit 31. As described later, this control adjusts the irradiating position of the electron beam relative to the substrate 15.

The beam modulating electrode 24 and the aperture 26 constitute an electron beam modulator. Specifically, the beam modulating electrode 24 performs ON/OFF modulation of electron beam irradiation onto the substrate 15 by electron beam blanking control based on a modulation signal from a beam modulating circuit 32.

That is, by applying a voltage to the beam modulating electrode 24 to greatly deflect the passing electron beam by means of, e.g., electrostatic deflection, the electron beam is blocked from passing through the aperture 26. In other words, the aperture 26 prevents the electron beam from being irradiated onto the substrate 15 (at "beam-off"). On the other hand, the electron beam is irradiated onto the substrate 15 (at "beam-on") when a voltage is not applied to the beam modulating electrode 24.

A beam current detector 27 for detecting beam fluctuation is provided on the aperture 26. More specifically, the beam current detector 27 is provided in the position onto which the electron beam is irradiated at beam-off. The electron beam current detected by the beam current detector 27 is supplied to a beam fluctuation measuring circuit 33. The beam fluctuation measuring circuit 33 calculates the position fluctuation value of the electron beam based on the detected current value.

The focus lens 28 is driven based on a drive signal from a focus control circuit 34 to perform the focus control of the electron beam.

The laser interferometer 35 measures the displacement of the X-stage 18 using laser light emitted from a light source in the laser interferometer 35. Namely, the laser interferometer 35 measures the displacement of the X-stage 18 based on laser light reflected from the reflecting mirror 35A provided on the X-stage 18 and sends the measurement data, that is, data about the position in the translation direction (X-direction) of the X-stage 18 to the translation drive portion 39 of the stage drive unit 37.

Also, a rotation signal of the spindle motor 17 is supplied to the rotation drive portion 38 of the stage drive unit 37. More specifically, the rotation signal includes an origin signal representing a reference rotation position of the substrate 15 and a pulse signal (i.e., a rotary encoder signal) for each displacement of a predetermined rotation angle from the reference rotation position. The rotation drive portion 38 obtains the rotation angle, the rotation speed, and the like of the turntable 16 (i.e., the substrate 15) from the rotation signal.

The stage drive unit 37 generates position data representing the position of the electron beam spot on the substrate based on the translation position data from the X-stage 18 and on the rotation signal from the spindle motor 17 and supplies the position data to the controller 30. Further, the stage drive unit 37 drives the spindle motor 17 and the translation motor 19 for rotation and translation drive based on a control signal from the controller 30.

The controller 30 is supplied with track pattern data used for optical discs, hard discs, discrete track media, patterned media, or the like, or data to be drawn by exposure (i.e., drawing data) RD.

Then, as described above, the beam modulating circuit 32 controls the beam modulating electrode 24 based on the drawing data RD to perform ON/OFF modulation of the electron beam (i.e., switching irradiation/non-irradiation onto the substrate 15) according to the drawing data RD.

The controller 30 sends a beam adjusting signal CA, a beam modulation signal CM, and a focus control signal CF to the beam deflection circuit 31, the beam modulating circuit 32, and the focus control circuit 34 respectively to perform data drawing (i.e., exposure or recording) control based on the record data RD. That is, the electron beam (EB) is irradiated onto a resist on the substrate 15 based on the record data RD, and latent images are formed in only the places exposed to the electron beam, and thereby the data is drawn.

[Configuration and Operation Related to Beam Position Fluctuation Correction]

Figure 2:
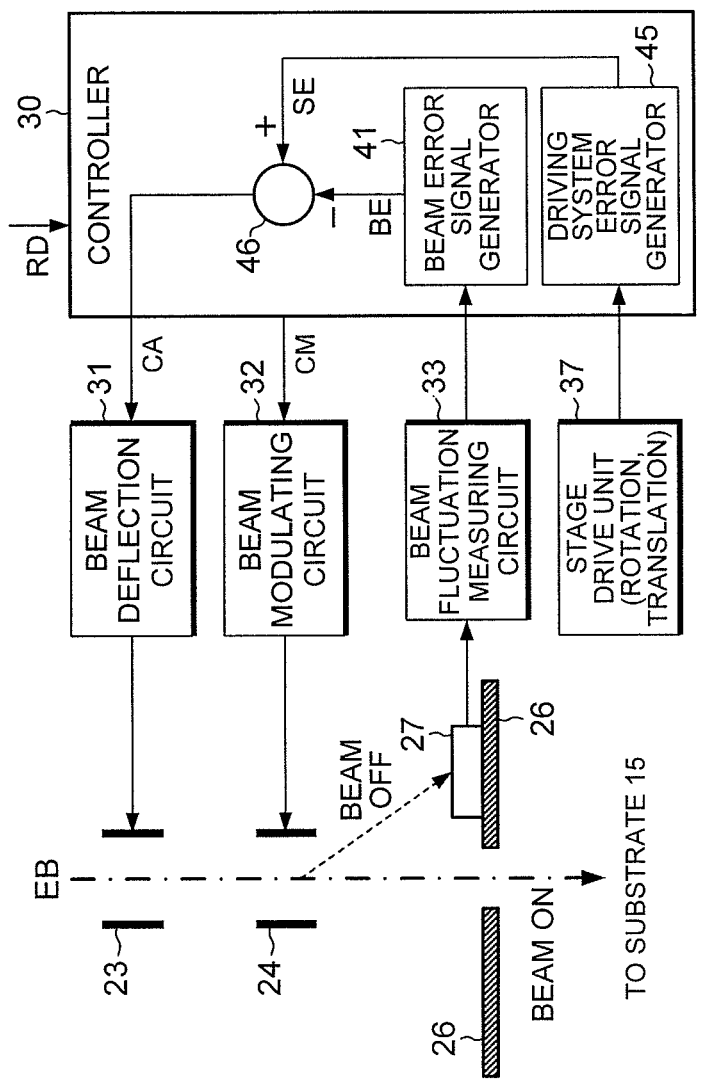
FIG. 2 is a block diagram showing schematically the configuration related to the deflection correction of an electron beam.

FIG. 2 is a block diagram showing schematically the configuration related to the deflection correction of the electron beam. The position error of the electron beam at electron beam drawing is detected, and in addition the beam position error due to the stage driving mechanism is detected so that the beam position correction is performed based on the detected errors.

The electron beam (EB) emitted from the electron gun 21 is modulated by the beam modulating circuit 32 based on the drawing data RD (i.e., the beam modulation signal CM). When the electron beam EB is blanked by the beam modulation signal CM not to be irradiated onto the substrate 15 (i.e., beam-off), the electron beam is detected by the beam current detector 27, and electron beam fluctuation values including a beam position fluctuation value at the beam current detector 27 are measured by the beam fluctuation measuring circuit 33. Then, a beam error signal generator 41 generates an error signal BE for the beam position based on the beam position fluctuation value and supplies to a beam correcting circuit 46.

Meanwhile, the rotation drive portion 38 and the translation drive portion 39 supply signals related to the rotation amounts and the translation amount (i.e., stage drive signals) to a driving mechanism system error signal generator (hereinafter simply called a driving system error signal generator) 45. The driving system error signal generator 45 generates a position error signal SE for the rotation drive and translation drive based on the drive signals and supplies to the beam correcting circuit 46.

The beam correcting circuit 46 generates control signals (i.e., correcting signals) for correction of the irradiation position of the electron beam onto the substrate 15 based on the beam position error signal BE and the stage position error signal SE. The beam deflection circuit 31 adjusts the beam position by the deflection control of the electron beam EB, thereby correcting the irradiation position of the electron beam onto the substrate 15.

[Detection of the Irradiation Position Error of the Electron Beam]

Next, the detection of the irradiation position error of the electron beam at the time of electron beam drawing will be described below in detail.

More specifically, when electron beam drawing is performed based on the drawing data RD, that is, when the electron beam is modulated, the electron beam (EB) is detected at the time of non-irradiation on the substrate 15. For example, assume that the electron beam EB is irradiated on the substrate 15 (i.e., beam-on) corresponding to a binary value "1" of the drawing binary data RD, and that the electron beam EB is deflected (or blanked) not to be irradiated thereon (i.e., beam-off) corresponding to a binary value "0". Then, the electron beam EB at beam-off (i.e., non-irradiation) is made incident on the beam current detector 27 provided on the aperture 26. Note that the electron beam EB may be irradiated on the substrate 15 corresponding to the binary value "0" of the drawing data RD (beam-on), and that the electron beam EB may be blanked not to be irradiated thereon corresponding to the binary value "1" (beam-off), so that the electron beam EB at beam-off (non-irradiation) is made incident on the beam current detector 27 provided on the aperture 26.

In other words, the electron beam EB is sampled at the time of beam-off caused by beam modulation to detect the beam current while electron beam drawing is being performed. Thus, beam fluctuation can be detected and measured in real time during drawing (i.e., exposure or recording) of the drawing data RD.

The beam current detector 27 has, for example, a Faraday cup (FC) and detects changes in the amount of beam current by the Faraday cup FC. Thereby, beam fluctuation such as beam irradiation position fluctuation can be detected. For example, the Faraday cup FC is placed in such a position that part (e.g., 50%) of the electron beam EB at beam-off (non-irradiation) is incident thereon. Or, the Faraday cup FC may be configured such that part of the electron beam EB at beam-off (non-irradiation) is blocked and made incident on the Faraday cup FC to be detected.

Where beam fluctuation such as beam irradiation position (i.e., irradiation position on the substrate 15) fluctuation at beam-on occurs due to fluctuation in the emission direction of the electron beam EB or the like, the beam current at beam-off (non-irradiation) also changes. Thus, changes in the amount of the beam current are detected by the beam current detector 27 (Faraday cup FC).

The beam current detector 27 may be configured as a division current detector having a plurality of detecting divisions receiving the electron beam EB at beam-off (non-irradiation). For example, the beam current detector 27 may be configured as a four-division current detector having four current detecting divisions and, based on changes in respective detected current values of the four current detecting divisions, can detect fluctuation in the electron beam EB, that is, fluctuation in the beam position, the beam shape such as beam diameters (longer diameter and shorter diameter), the beam amount, and the like.

The beam current detected by the beam current detector 27 is supplied to the beam fluctuation measuring circuit 33. The beam fluctuation measuring circuit 33 calculates the fluctuation value of the irradiation position of the electron beam based on the detected current value.

The beam position fluctuation value calculated by the beam fluctuation measuring circuit 33 is supplied to the beam error signal generator 41. The beam error signal generator 41 generates the error signal BE for the beam position on the substrate 15 of the electron beam EB based on the beam position fluctuation value from the beam fluctuation measuring circuit 33.

Figure 3:
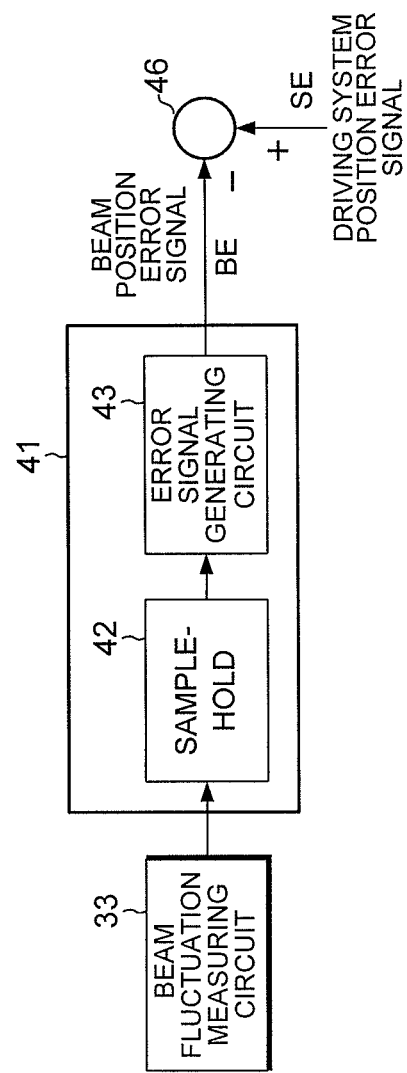
FIG. 3 is a block diagram showing schematically a beam error signal generator when the generator comprises a sample-hold circuit and an error signal generating circuit.
Figure 4:
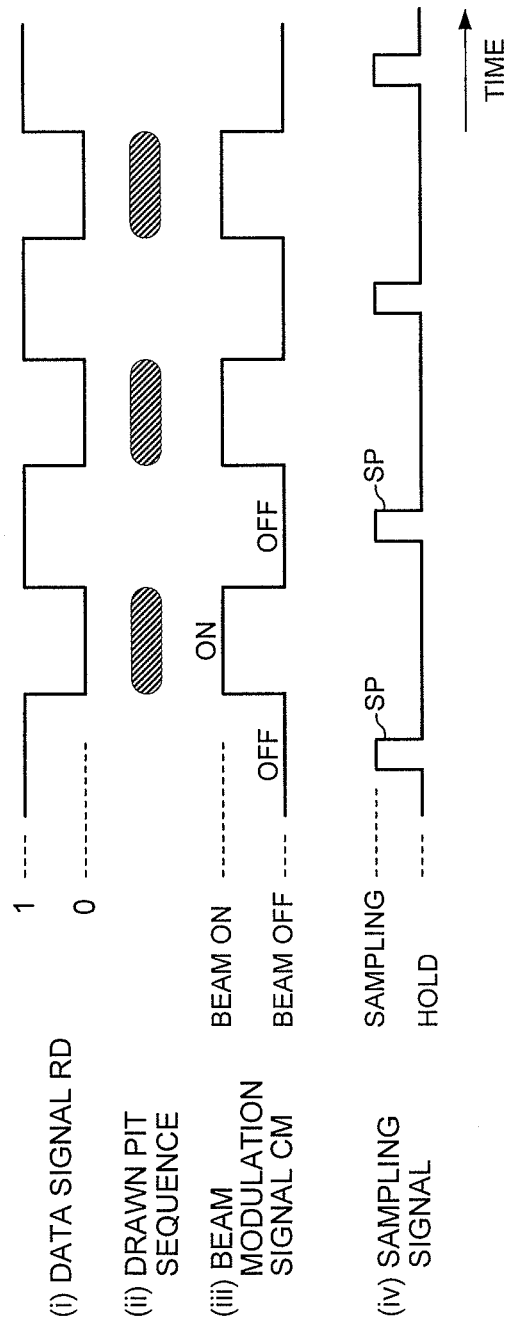
FIG. 4 is a diagram showing schematically a relationship between binary data RD, irradiation/non-irradiation of the electron beam, and beam current detection timings.

The case where the beam error signal generator 41 comprises, for example, a sample-hold circuit 42 and an error signal generating circuit 43 will be described below with reference to FIG. 3. The beam position fluctuation value from the beam fluctuation measuring circuit 33 is supplied to the sample-hold circuit 42, and the sampled beam position fluctuation value is held therein. More specifically, the case will be described where, as shown in FIG. 4, a pit (latent image) ((ii) of FIG. 4) is drawn corresponding to a value "0" of the drawing binary data RD ((i) of FIG. 4) and where when the value is "1", a pit is not drawn. In this case, the controller 30 generates the beam modulation signal CM ((iii) of FIG. 4) such that the electron beam EB is irradiated on the substrate 15 (beam-on) corresponding to a value "0" of the drawing data RD, and that the electron beam EB is blanked not to be irradiated thereon (beam-off) corresponding to a value "1". And the electron beam EB at beam-off (non-irradiation) is made incident on the beam current detector 27 provided on the aperture 26.

Note that it may be configured such that conversely, the electron beam EB is irradiated onto the substrate 15 (beam-on) corresponding to a value "1" of the drawing data RD and that the electron beam EB is not irradiated thereon (beam-off) corresponding to a value "0" so that the electron beam EB at beam-off (non-irradiation) is made incident on the beam current detector 27 provided on the aperture 26.

In the beam-off (non-irradiation) during which pit drawing is not performed, the sample-hold circuit 42 samples in response to a sampling signal (sampling pulses SP) ((iv) of FIG. 4) the beam position fluctuation value from the beam fluctuation measuring circuit 33 to be held.

The position fluctuation value (or hold value) is supplied to the error signal generating circuit 43, which based on the hold value, generates the beam position error signal BE representing the error of the beam irradiation position from a beam reference position. The beam position error signal BE is supplied to the beam correcting circuit 46. Note that the beam reference position refers to the irradiation position in the beam current detector 27 when there is no beam position fluctuation.

The sample-hold circuit 42 and the error signal generating circuit 43 are provided in, e.g., the controller 30, and their operations are controlled by the controller 30.

In the above, sampling is performed in the beam-off (non-irradiation) during which no pit is formed, but it is possible to perform sampling during the beam-on period in an effective manner. That is, the system can be configured such that sampling is performed during the beam-on (irradiation) period with a beam fluctuation measuring signal (pulses) being superimposed on the beam modulation signal. As described later, this is because by switching to beam-off for sampling for only a short time during the beam-on period, the resist can be exposed (drawn into) continuously in an effective manner.

Figure 5:
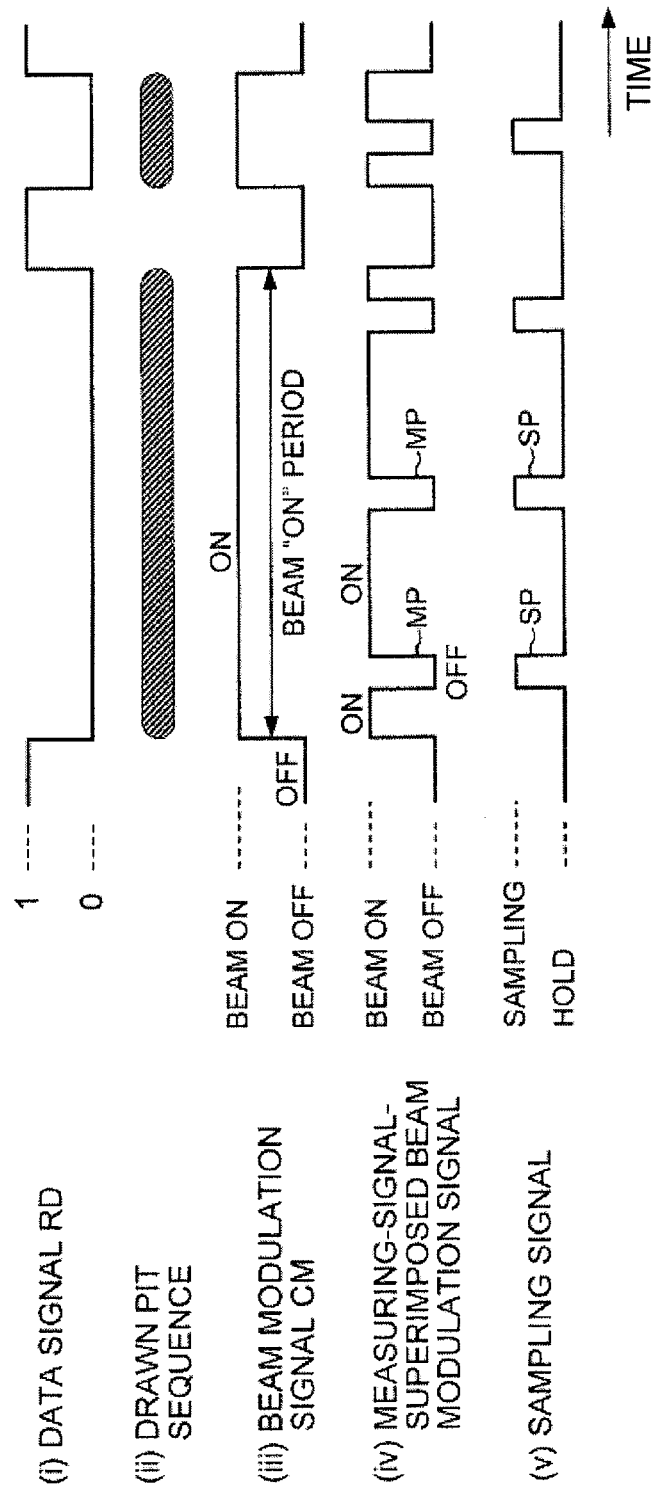
FIG. 5 is a diagram showing schematically an operation where in the beam-on period, beam fluctuation measuring pulses (MP) are superimposed on a beam modulation signal for beam current detection.

More specifically, as shown in FIG. 5, where a pit length is long ((ii) of FIG. 5) or there is no beam-off (non-irradiation) period (e.g., when a groove is formed) or so on, in the beam-on period during which the beam is to be irradiated on the substrate, beam fluctuation measuring pulses (MP) are superimposed on the beam modulation signal ((iv) of FIG. 5). During the period when the beam fluctuation measuring pulse (MP) is superimposed, the beam is made "off" (i.e., non-irradiation), and hence it can be configured such that sampling is performed during this measuring pulse (MP) superimposed period.

For example, the controller 30 is configured to superimpose the beam fluctuation measuring signal MP on a beam modulation signal ((iii) of FIG. 5) corresponding to the drawing data RD so as to produce the beam modulation signal CM. In this case, the controller 30 serves as a fluctuation measuring beam switching portion that controls the beam modulating circuit 32 to switch the beam to non-irradiation. The beam current detector 27 detects the beam current during the switched period (i.e., measuring pulse superimposed period). Then, based on the detected current value, a beam fluctuation value is calculated.

The measuring pulse superimposed period can be made so short as not to affect the continuous exposure (or drawing) of the resist. That is, when pits or a groove is formed, the measuring pulse superimposed period can be set to have such a length that a discontinuity does not occur in the pit or groove according to the movement speed (i.e., linear velocity) of the drawing beam on the substrate 15, a resist characteristic (or sensitivity), and so on.

With this configuration, even if the pit length is long and thus the beam-off (or non-irradiation) period is long, beam fluctuation correction can be performed at high frequency, because beam fluctuation measurement can be performed at short sampling intervals. Further, even where there is no beam-off (non-irradiation) period, for example, where a groove is formed or so on, beam fluctuation measurement can be performed, and thus beam fluctuation correction can be performed with high frequency.

As described above, while the electron beam is modulated between ON and OFF states (or irradiation and non-irradiation states) by the modulation signal corresponding to the drawing binary data RD, the beam position error is detected at non-irradiation of the electron beam on the substrate 15 based on the electron beam modulation signal. Then, the electron beam is corrected based on the detected position error. Thus, beam fluctuation is detected in real time to perform beam correction while data is being drawn, thus providing feedback control correction.

[Detection of the Position Error of the Stage Driving Mechanism]

Next, the detection of the beam position error due to the stage driving mechanism will be described below in detail.

More specifically, the rotation drive portion 38 and the translation drive portion 39 supply stage drive signals for rotation drive and translation drive to the driving system error signal generator 45. The driving system error signal generator 45 generates the position error signal SE for the rotation drive and translation drive based on the drive signals.

Figure 6:
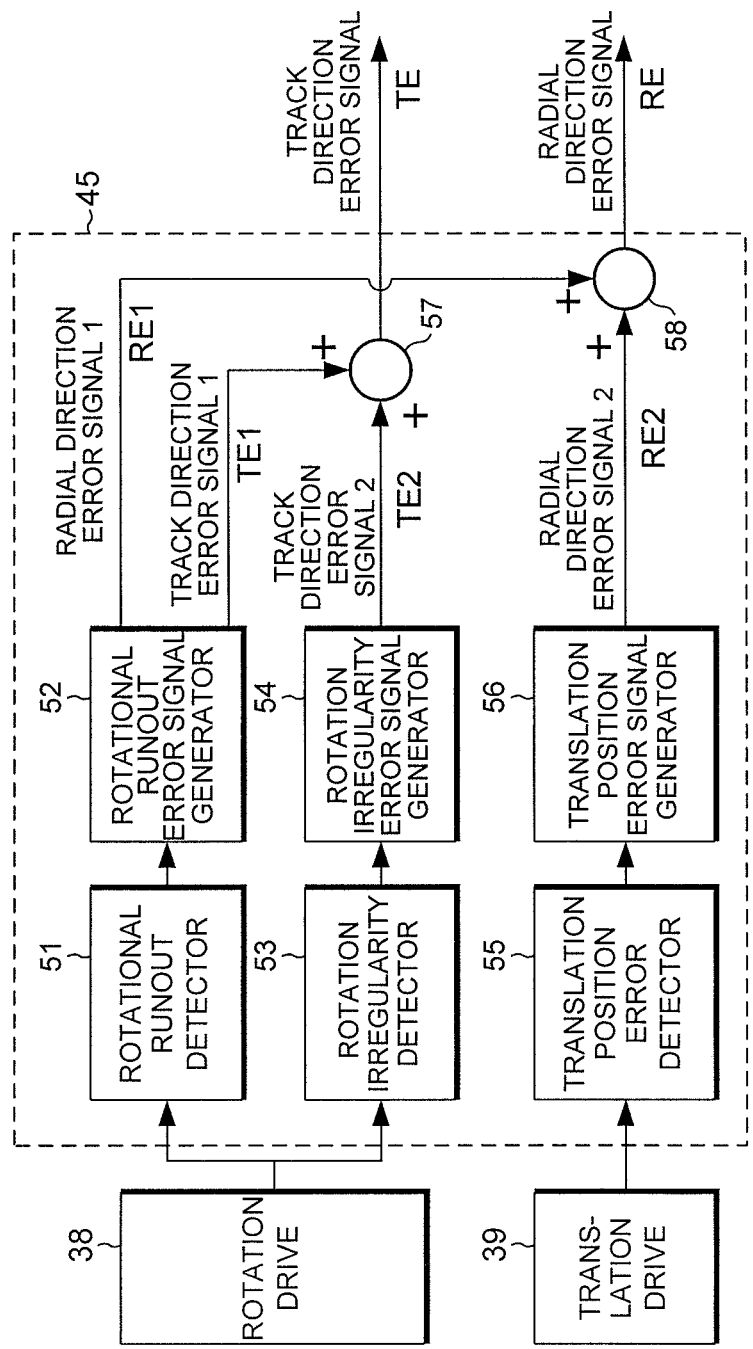
FIG. 6 is a block diagram showing an example of the configuration of a driving system error signal generator.

FIG. 6 is a block diagram showing an example of the configuration of the driving system error signal generator 45. A rotation signal representing the rotation speed, the rotation angle, and the like is supplied from the rotation drive portion 38 to a rotational runout detector 51 and a rotation irregularity detector 53. The rotational runout detector 51 detects the rotational displacement of the turntable 16 occurring due to eccentricity or the like and supplies to a rotational runout error signal generator 52. The rotational runout error signal generator 52 generates a position error signal RE1 of a radial direction and a position error signal TE1 of a tangential direction (or track direction) from the rotational displacement representing the rotational runout.

The rotation irregularity detector 53 detects the rotational fluctuation due to variations of the rotation speed of the turntable 16 and supplies to a rotation irregularity error signal generator 54. The rotation irregularity error signal generator 54 generates a position error signal TE2 of tangential direction (or track direction) from the rotational fluctuation.

A displacement signal of translation direction is supplied from the translation drive portion 39 to a translation position detector 55, which detects the translation position. A translation position signal representing the translation position is supplied to a translation position error signal generator 56, which generates a translation position error signal RE2.

The tangential position error signals TE1 and TE2 are added together by an adder 57 and supplied as a composite position error signal TE of tangential direction to the correcting signal generator 46. Likewise, the radial position error signals RE1 and RE2 are added together by an adder 58 and supplied as a composite position error signal RE of radial direction to the beam correcting circuit 46. That is, the stage position error signal SE mentioned above consists of the tangential position error signal TE and the radial position error signal RE.

The beam correcting circuit 46 generates a correcting signal to correct the irradiation position of the electron beam on the substrate 15 based on the beam position error signal BE from the beam error signal generator 41 and on the stage position error signal SE (i.e., tangential and radial position error signals TE, RE) from the driving system error signal generator 45, and controls the beam deflection circuit 31 via the correcting signal. By this beam correction, the beam position fluctuation is corrected when the electron beam EB is irradiated on the substrate 15.

The above-mentioned stage position errors (i.e., rotation and translation position errors) are detected synchronously with the detection of the beam position error, and the stage position error signal SE and the beam position error signal BE are generated. The beam irradiation position on the substrate 15 is corrected based on the stage position error signal SE and the beam position error signal BE. In other words, a closed servo loop with the mechanism system position errors and the beam position error is formed to provide feedback control.

As described above, while the electron beam is being ON/OFF-modulated (i.e., irradiation/non-irradiation-modulated) by the modulation signal corresponding to the drawing binary data RD, the beam position error is detected at non-irradiation of the electron beam on the substrate 15 according to the electron beam modulation signal. Then, the electron beam is corrected based on the detected position error. Thus, while data is being drawn, beam fluctuation is detected in real time to perform beam correction, thus providing feedback control correction.

Further, according to the present embodiment, feedback control is provided wherein the position error due to the electron beam irradiating system and the position errors due to the stage driving mechanism system are detected, and wherein the beam irradiation position on the substrate 15 is corrected with feedback of the correction results. In other words, by placing the mechanism system position errors in the closed servo loop for beam position error correction, the controls of the mechanism system position error correction and the beam position error correction can be performed in parallel. Also, the effect of the correction is greatly improved as compared with the conventional feed-forward control.

What is claimed is:

1. An electron beam lithography apparatus in which a substrate is mounted on a stage that is driven to rotate and move translationally and which performs drawing by switching between irradiation and non-irradiation of an electron beam on said substrate by means of deflection of the electron beam according to drawing data, said lithography apparatus comprising:
   a beam current detector configured to detect, during drawing of said drawing data, fluctuation of an irradiation position of said electron beam at non-irradiation on said substrate;
   a beam position error detector configured to detect a beam position error of said electron beam based on the fluctuation of the irradiation position;
   a drive position error detector configured to detect a drive position error of said stage due to rotation and translation drive during drawing of said drawing data; and
   a corrector configured to correct the irradiation position of said electron beam during the drawing based on said beam position error and said drive position error;
   wherein the beam current detector is located upstream of substrate and the substrate stage.

2. An electron beam lithography apparatus according to claim 1, wherein said beam position error is calculated based on the difference between said irradiation position detected by said beam current detector and a beam reference position.

3. An electron beam lithography apparatus according to claim 1, wherein at non-irradiation of said electron beam, said electron beam is made incident on said beam current detector.

4. An electron beam lithography apparatus according to claim 1, wherein said corrector performs feedback control based on said beam position error and said drive position error.

5. An electron beam lithography apparatus according to claim 1, comprising a fluctuation measuring beam switching unit configured to switch said electron beam to non-irradiation during the period when said electron beam is to be irradiated on said substrate,
   wherein said beam current detector detects a beam current of said electron beam during the period when said electron beam is switched to non-irradiation.

* * * * *